(12) United States Patent
Kim et al.

(10) Patent No.: US 11,862,367 B2
(45) Date of Patent: Jan. 2, 2024

(54) ESL-LESS AC RESISTOR FOR HIGH FREQUENCY APPLICATIONS

(71) Applicant: QUALCOMM Incorporated, San Diego, CA (US)

(72) Inventors: Jonghae Kim, San Diego, CA (US); Sang-June Park, San Diego, CA (US); Je-Hsiung Lan, San Diego, CA (US); Ranadeep Dutta, Del Mar, CA (US)

(73) Assignee: QUALCOMM Incorporated, San Diego, CA (US)

( * ) Notice: Subject to any disclaimer, the term of this patent is extended or adjusted under 35 U.S.C. 154(b) by 71 days.

(21) Appl. No.: 17/643,685

(22) Filed: Dec. 10, 2021

(65) Prior Publication Data

US 2023/0187106 A1  Jun. 15, 2023

(51) Int. Cl.
*H01C 7/00* (2006.01)

(52) U.S. Cl.
CPC ..................... *H01C 7/006* (2013.01)

(58) Field of Classification Search
CPC ........ H01C 7/006; H01C 10/48; H01C 1/012; H01L 49/02; H01L 21/20
USPC ................. 338/307, 308, 313, 332
See application file for complete search history.

(56) References Cited

U.S. PATENT DOCUMENTS

| | | | | |
|---|---|---|---|---|
| 6,801,118 B1 * | 10/2004 | Ikemoto | ................... | H01C 1/14 338/307 |
| 2008/0298031 A1 * | 12/2008 | Korony | ..................... | H01P 1/20 29/846 |
| 2019/0206980 A1 * | 7/2019 | Jan | ..................... | H01L 21/28556 |
| 2020/0051718 A1 | 2/2020 | Cheng et al. | | |

FOREIGN PATENT DOCUMENTS

WO  2020053141 A1  3/2020

OTHER PUBLICATIONS

International Search Report and Written Opinion—PCT/US2022/077241—ISA/EPO—dated Feb. 1, 2023.

* cited by examiner

*Primary Examiner* — Edwin A. Leon
*Assistant Examiner* — Iman Malakooti
(74) *Attorney, Agent, or Firm* — QUALCOMM INCORPORATED

(57) ABSTRACT

Disclosed is a sheet resistor designed to operate in a high frequency environment. Unlike conventional sheet resistors, the equivalent series inductance (ESL) is minimized or even eliminated altogether when using the designed sheet resistor. As a result, better signal isolation can be achieved.

27 Claims, 15 Drawing Sheets

US 11,862,367 B2

ESL-LESS AC RESISTOR FOR HIGH FREQUENCY APPLICATIONS

FIELD OF DISCLOSURE

This disclosure relates generally to resistors, and more specifically, but not exclusively, to a resistor configured to reduce or even eliminate equivalent series inductance (ESL) when operating in high frequency conditions and fabrication techniques thereof.

BACKGROUND

Integrated circuit technology has achieved great strides in advancing computing power through miniaturization of active and passive components. The package devices can be found in many electronic devices, including processors, servers, radio frequency (RF) integrated circuits, etc.

For high frequency (e.g., in multiple GHz) applications, a resistor can be used to isolate different input signals in devices such as power combiners. Unfortunately, at such high frequencies, the resistor can also behave like an inductor due to the magnetic flux caused by the high frequency AC current. As a result, impedance matching and performance can be reduced.

Accordingly, there is a need for systems, apparatus, and methods that overcome the deficiencies of conventional RF filters including the methods, system and apparatus provided herein.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

An exemplary sheet resistor is disclosed. The sheet resistor may comprise an upper portion. A first end of the upper portion may be connected to a first port and a second end of the upper portion may be connected to a second port. The sheet resistor may also comprise a lower portion. A first end of the lower portion may be connected to the first port and a second end of the lower portion may be connected to the second port. The upper portion and the lower portion may be connected in parallel between the first port and the second port. The first end and the second end of the upper portion may be respectively connected to the first end and the second end of the lower portion such that a closed loop void is formed between the upper portion and the lower portion.

An exemplary power combiner is disclosed. The power combiner may comprise one or more resistors comprising a sheet resistor. The power combiner may also comprise one or more capacitors comprising a first capacitor, a second capacitor, and a third capacitor. The power combiner may further comprise one or more inductors comprising a first inductor and a second inductor. The sheet resistor may be is electrically connected between a first input port and a second input port. The first capacitor may be electrically connected between the first input port and a ground, the second capacitor may be electrically connected between the second input port and the ground, and the third capacitor may be electrically connected between an output port and the ground. The first inductor may be electrically connected between the first input port and the output port, and the second inductor may be electrically connected between the second input port and the output port. The sheet resistor may comprise an upper portion. A first end of the upper portion may be connected to the first input port and a second end of the upper portion may be connected to the second input port. The sheet resistor may also comprise a lower portion. A first end of the lower portion may be connected to the first input port and a second end of the lower portion may be connected to the second input port. The upper portion and the lower portion may be connected in parallel between the first input port and the second input port. The first end and the second end of the upper portion may be respectively connected to the first end and the second end of the lower portion such that a closed loop void is formed between the upper portion and the lower portion.

A method of fabricating sheet resistor is disclosed. The method may comprise forming an upper portion. A first end of the upper portion may be connected to a first port and a second end of the upper portion may be connected to a second port. The method may also comprise forming a lower portion. A first end of the lower portion may be connected to the first port and a second end of the lower portion may be connected to the second port. The upper portion and the lower portion may be connected in parallel between the first port and the second port. The first end and the second end of the upper portion may be respectively connected to the first end and the second end of the lower portion such that a closed loop void is formed between the upper portion and the lower portion.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure.

Figure 1:
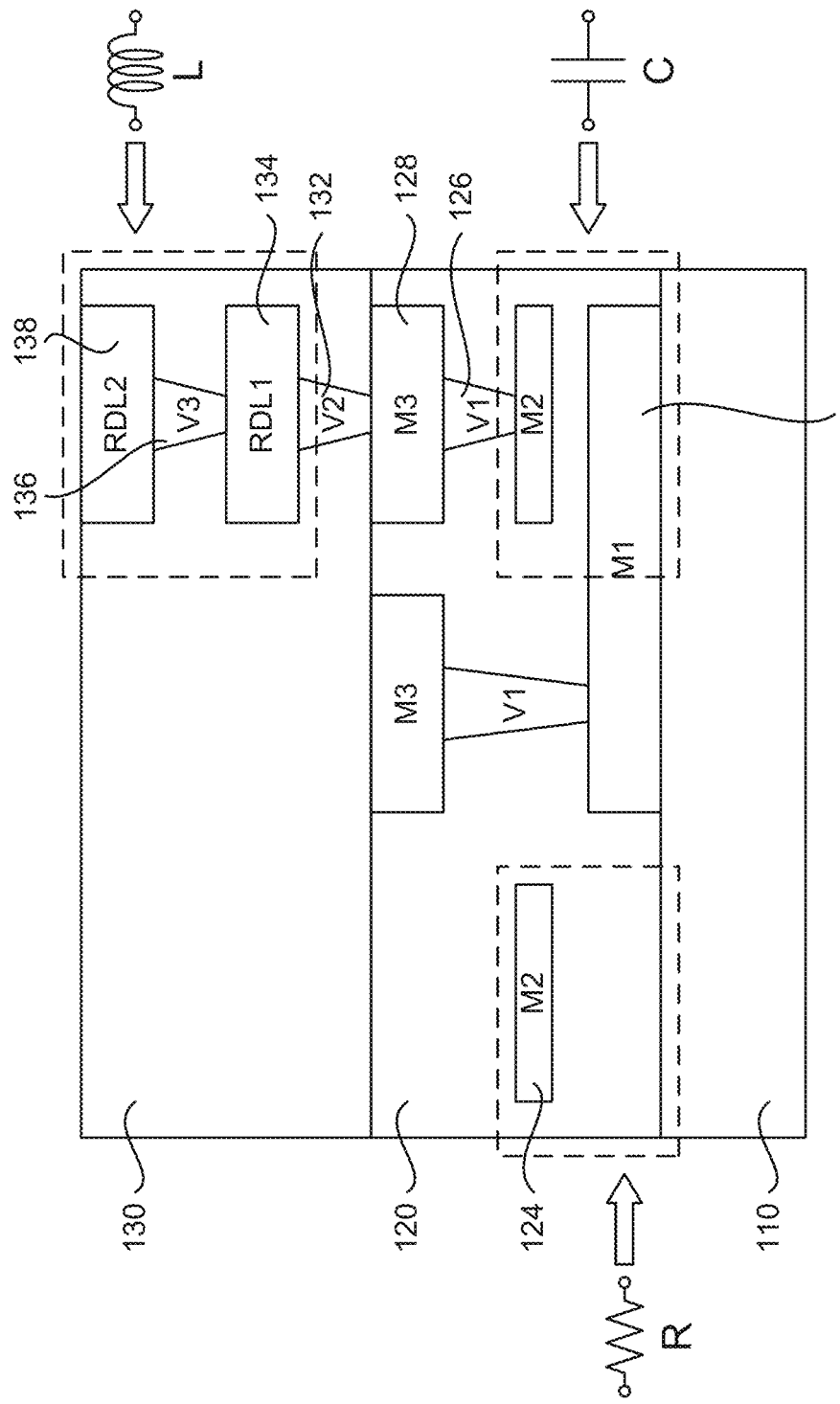
FIG. 1 illustrates examples of passive components fabricated in a semiconductor device in accordance with one or more aspects of the disclosure.

Other objects and advantages associated with the aspects disclosed herein will be apparent to those skilled in the art based on the accompanying drawings and detailed description. In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the present disclosure are illustrated in the following description and related drawings directed to specific embodiments. Alternate aspects or embodiments may be devised without departing from the scope of the teachings herein. Additionally, well-known elements of the illustrative embodiments herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more exemplary embodiments. In such instances, internal details of the known, conventional component structures and/or portions of operations may be omitted to help avoid potential obfuscation of the concepts illustrated in the illustrative embodiments disclosed herein.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

FIG. 1 illustrates a cross-sectional view of passive components that may be fabricated in a semiconductor device 100. In an aspect, the semiconductor device 100 may comprise an integrated passive device (IPD) that includes one or more inductors, one or more capacitors, and one or more resistors. The semiconductor device 100 may comprise a substrate 110 (e.g., a high-resistivity silicon (HRS) substrate), a first passivation layer 120 (e.g., a first dielectric layer) on the substrate 110, and a second passivation layer 130 (e.g., a second dielectric layer).

In the first passivation layer 120, first metallization layers 122 (also referred to as M1 layers) may be formed on the substrate 110, second metallization layers 124 (also referred to as M2 layers) may be formed above the first metallization layers 122, and third metallization layers 128 (also referred to as M3 layers) may be formed above the second metallization layers 124. First conductive vias 126 (also referred to as V1 vias) may also be formed. Some first conductive vias 126 may electrically couple some first metallization layers 122 with some second metallization layers 124. Other first conductive vias 126 may electrically couple other first metallization layers 122 with some third metallization layers 128.

In the second passivation layer 130, first redistribution layers (RDLs) 134 (also referred to as RDL1) may be formed, and second redistribution layers 138 (also referred to as RDL2) may be formed above the first redistribution layers 134. The first and second redistribution layers 134, 138 may also respectively be referred to as fourth and fifth metallization layers (or M4 layers, M5 layers). Second conductive vias 132 (also referred to as V2 vias) and third conductive vias 136 (also referred to as V3 vias) may also be formed. Some second conductive vias 132 may electrically couple some third metallization layers 128 with some first redistribution layers 134. Also, some third conductive vias 136 may electrically couple some first redistribution layers 134 with some second redistribution layers 138.

At least one second metallization layer 124 may be fabricated as a sheet resistor R (discussed in more detail below). At least one combination of a first metallization layer 122 and a second metallization layer 124 with a dielectric therebetween may be fabricated as a capacitor C. Further, at least one combination of some first and second redistribution layers 134, 138 along with the some third conductive vias 136 may be fabricated as an inductor L.

Figure 2:
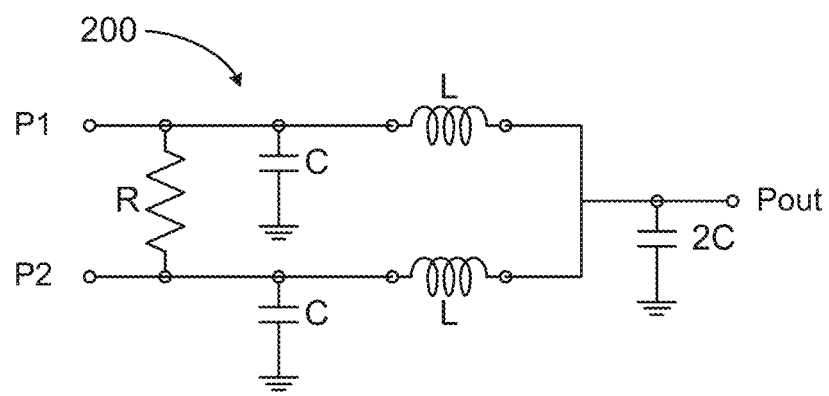
FIGS. 2 and 3 illustrate schematics of example devices incorporating passive components in accordance with one or more aspects of the disclosure.
Figure 3:
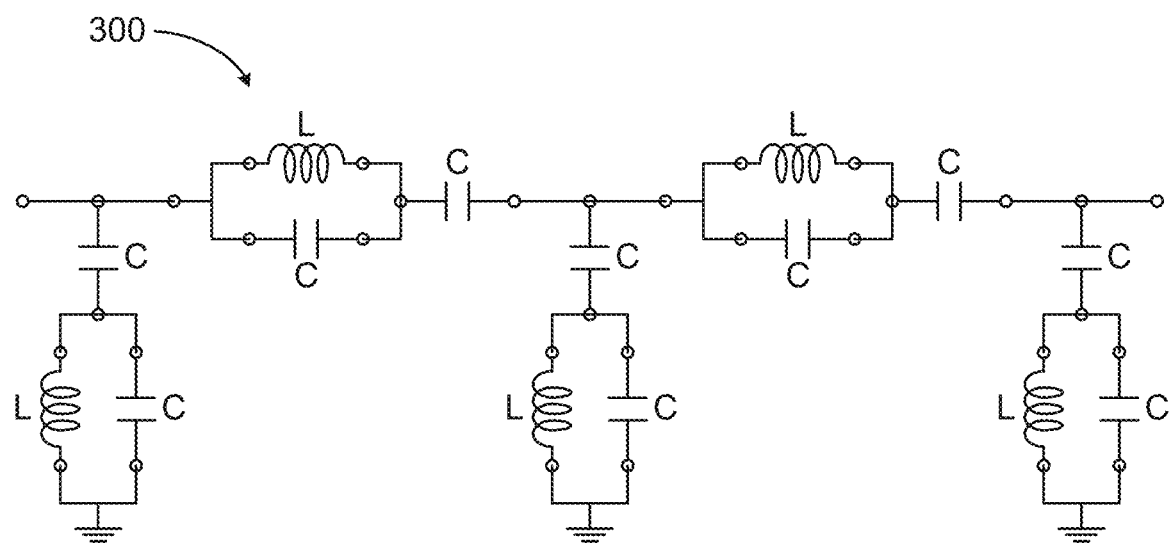

FIG. 2 illustrate a schematic of a power combiner 200 constructed from passive devices including resistors R, capacitors C and inductors L. The power combiner 200 combines signals provided at input ports P1 and P2 and outputs a combined result at an output port Pout. FIG. 3 illustrates a schematic of a broadband filter 300 constructed from passive devices including capacitors C and inductors L. Both the power combiner 200 and the broadband filter 300 may be fabricated through semiconductor fabrication technologies as represented by the passive devices of the semiconductor device 100 of FIG. 1.

Figure 4:
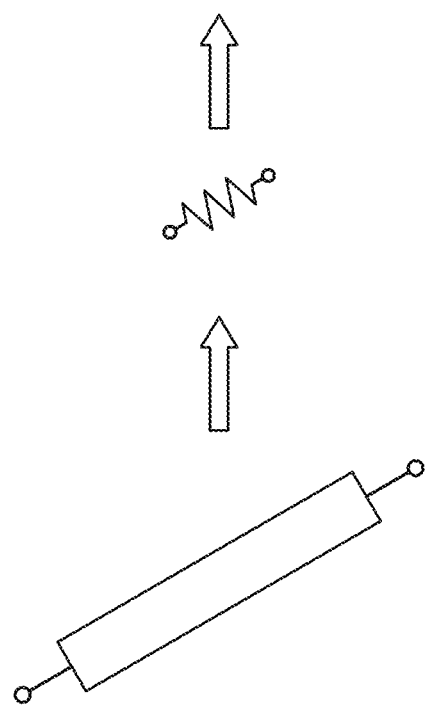
FIGS. 4 and 5 illustrate examples of conventional sheet resistors.
Figure 4:
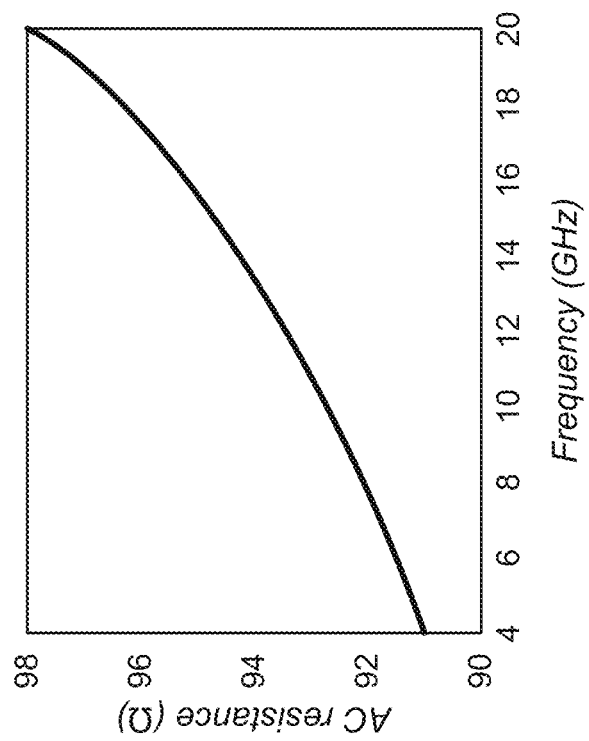

FIG. 4 illustrate an example of a conventional sheet resistor, which is rectangular in shape. As seen, the resistance R (or more generally impedance Z) of the sheet resistor can change depending on the frequency. That is, the AC resistance of the sheet resistor can change. In this instance, it is seen that the AC resistance can increase as the frequency increases.

Figure 5:
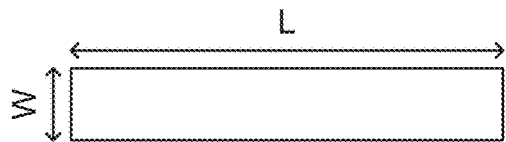

FIG. 5 shows some details of the conventional sheet resistor. As seen, a sheet resistor may have a per square resistance (□). This per square resistance—also referred to as sheet resistance $R_S$—is typically independent of the size of the square itself. The total resistance of the sheet resistor may then be determined by multiplying the aspect ratio (AR) by the per square resistance $R_S$. AR may be defined as length (L) divided by width (W) of the sheet resistor. That is R=AR*$R_S$. For example, if the sheet (or per square) resistance $R_S$=16Ω/□ and if a 96Ω sheet resistor is desired, then the sheet resistor may be fabricated such that its AR=6.

Figure 6A:
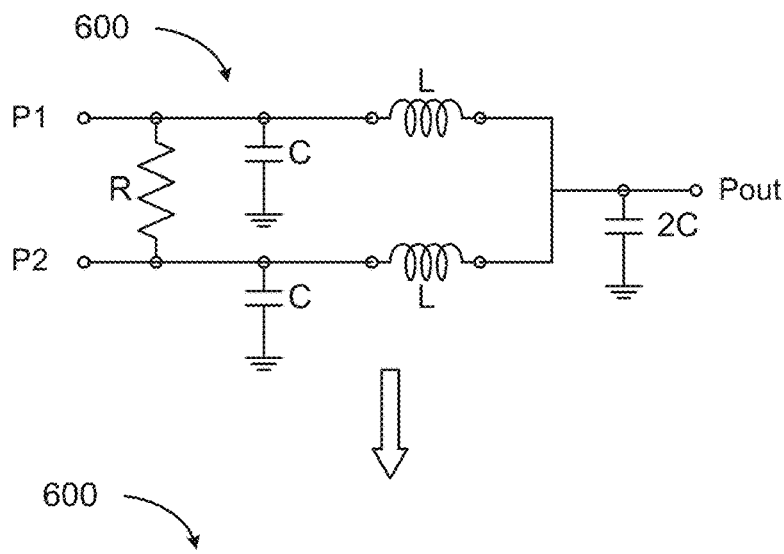
FIG. 6A illustrates a schematic of a power combiner and FIG. 6B illustrates a layout of the power combiner of FIG. 6A incorporating a conventional sheet resistor.
Figure 6B:
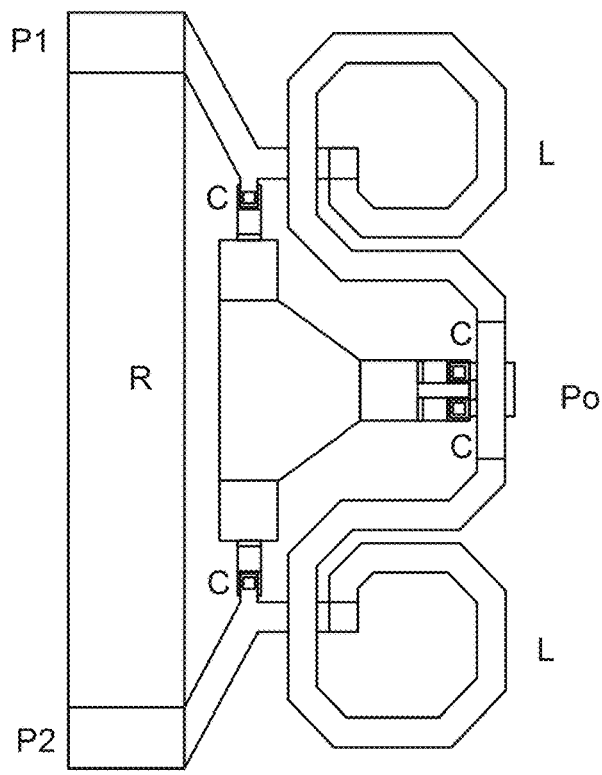

FIG. 6A illustrates a schematic of a power combiner 600, and FIG. 6B illustrates a layout of the same power combiner 600. The power combiner 600 may be the same or similar as the power combiner 200 of FIG. 2. That is, the power combiner 600 combines signals provided at input ports P1 and P2 and outputs the combined result at an output port Pout. The power combiner 600 comprises a resistor R, a plurality of capacitors C, and a plurality of inductors L. Note that as seen in FIG. 6B, the resistor R of the power combiner 600 is a conventional sheet resistor, i.e., a rectangularly shaped sheet resistor.

Figure 7A:
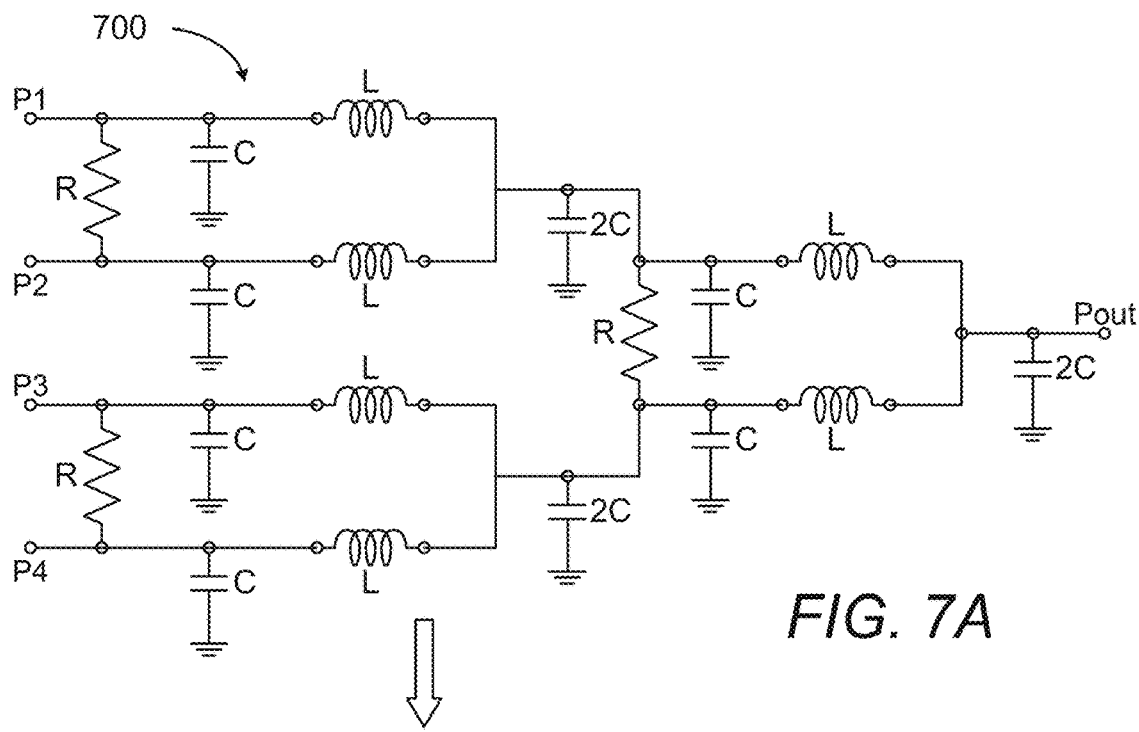
FIG. 7A illustrates a schematic of another power combiner and FIG. 7B illustrates a layout of the power combiner of FIG. 7A incorporating multiple conventional sheet resistors.
Figure 7B:
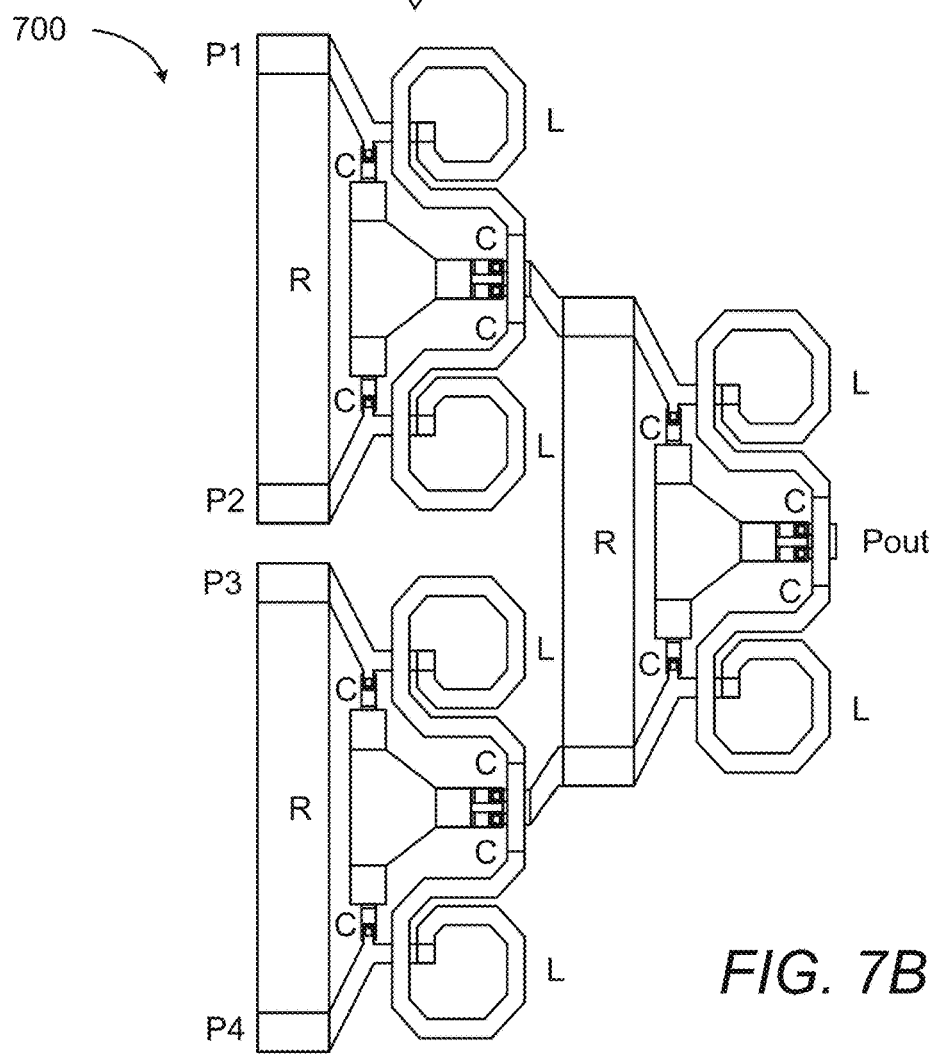

Power combiners can be more complex as seen in FIGS. 7A and 7B illustrating a power combiner 700. As seen in the schematic of FIG. 7A and in the layout of FIG. 7B, the power combiner 700 combines signals provided at input ports P1, P2, P3 and P4 and outputs the combined result at an output port Pout. The power combiner 700 comprises a plurality of resistors R, a plurality of capacitors C, and a plurality of inductors L. The resistors R of the power combiner 700 are conventional sheet resistors.

Figure 8:
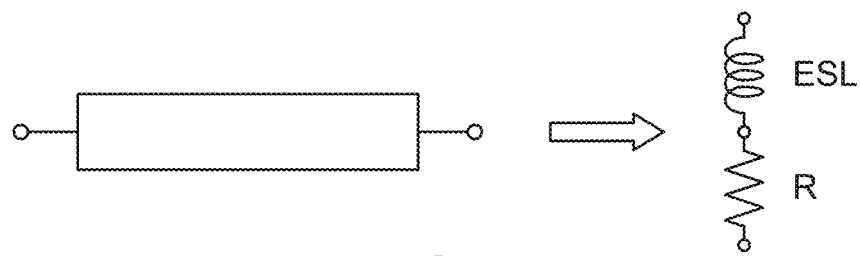
FIG. 8 illustrates a conventional sheet resistor modeled as having equivalent series inductor during a high frequency operation.

When operating at high frequencies (e.g., 10 GHz or higher), the conventional rectangular sheet resistor also behave as an inductor due to the induced magnetic flux. FIG. 8 illustrates the conventional sheet resistor may be modeled as an inductor in series with the resistor. This inductor may also be referred to as equivalent series inductor (ESL).

Figure 9:
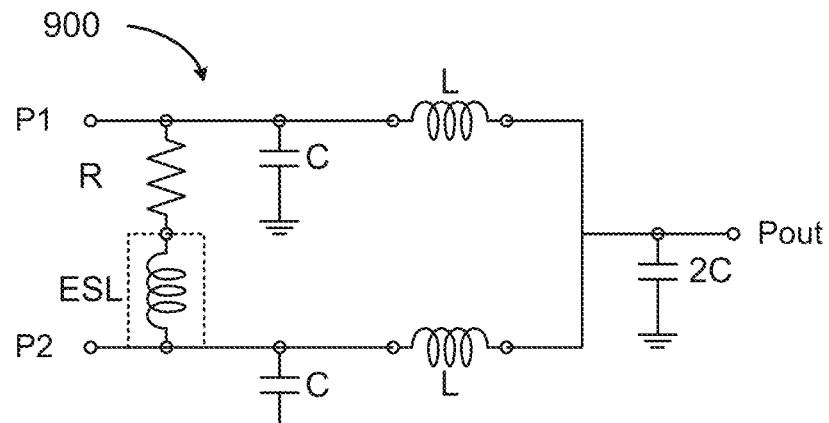
FIG. 9 illustrates a schematic of a power combiner with a conventional sheet resistor modeled as having equivalent series inductor during a high frequency operation.
Figure 10:
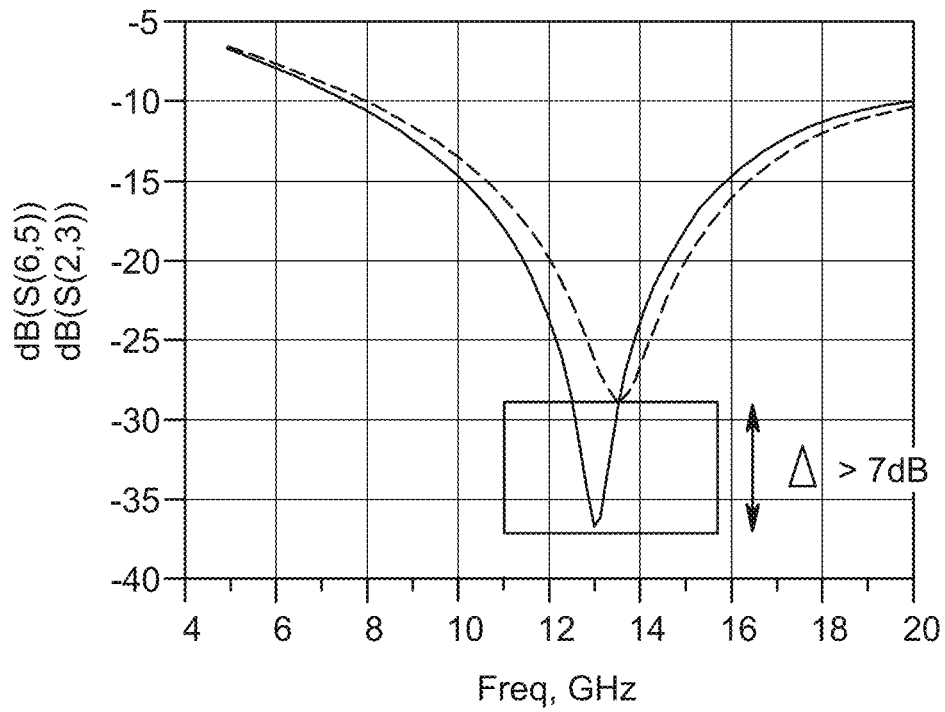
FIG. 10 illustrates a graph of performance of a resistor with and without equivalent series inductor.

FIG. 9 illustrates a schematic of a power combiner 900 with the conventional sheet resistor modeled as shown in FIG. 8, e.g., when operating in a high frequency environment. Unfortunately, the ESL can distort impedance matching and performance in circuits such as power combiners. As seen in FIG. 10, the ESL can reduce performance by as much as 7 dB or more at frequencies of interest.

To address some or all issues of conventional sheet resistors, it is proposed to reduce or even eliminate ESL of an AC resistor through a self-inductance cancellation technique. In general, a sheet resistor that includes meandering portions is proposed. For example, the proposed sheet resistor may include an upper portion and a lower portion. The upper and lower portions may both meander between two ports. Also, the upper and lower portions may meander such that a closed loop void is formed.

Figure 11:
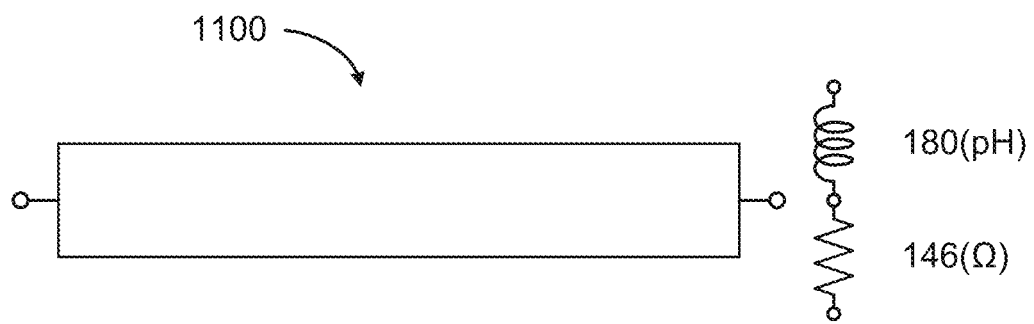
FIGS. 11, 12, and 13 illustrates example inductance and resistance values of various sheet resistors during a high frequency operation in accordance with one or more aspects of the disclosure.
Figure 12:
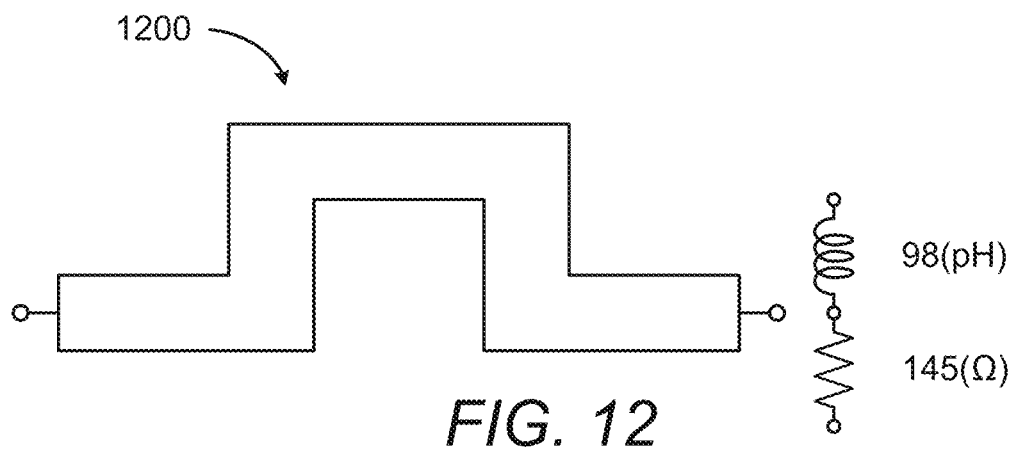
Figure 13:
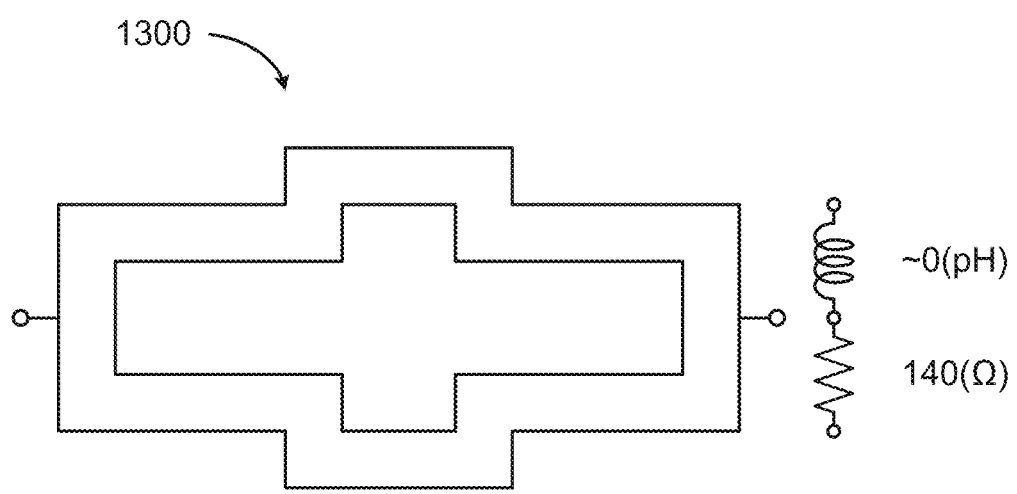

As a demonstration, inductance and resistance values of different sheet resistors at an example frequency of interest (e.g., 11 GHz) are provided in FIGS. 11, 12 and 13. FIG. 11 illustrates a conventional rectangular sheet resistor 1100, FIG. 12 illustrates an improved sheet resistor 1200, and FIG. 13 illustrates an example of a proposed sheet resistor 1300. As seen, the resistance values of the three sheet resistors 1100, 1200 and 1300 are very similar.

However, the ESL inductance values of the resistors can vary significantly. For example, the ESL inductance of the conventional sheet resistor 1100 may be as much as 180 pH. The sheet resistor 1200, at 98 pH, is an improvement over the conventional sheet resistor 1100. On the other hand, for the proposed sheet resistor 1300, the ESL inductance is nearly zero, i.e., nearly eliminated. That is, the proposed sheet resistor 1300 may be "ESL-less".

Figure 14A:
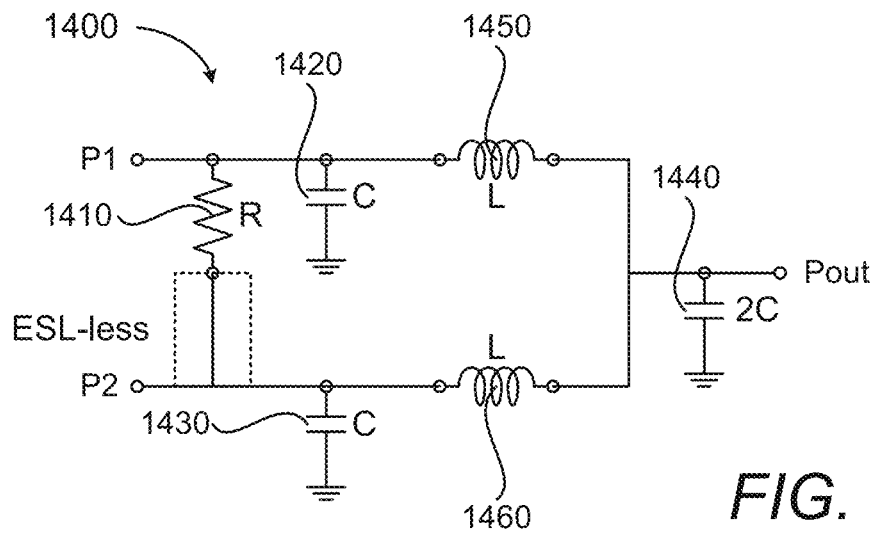
FIG. 14A illustrates a schematic of a power combiner and FIG. 14B illustrates a layout of the power combiner of FIG. 14A incorporating a novel sheet resistor in accordance with one or more aspects of the disclosure.
Figure 14B:
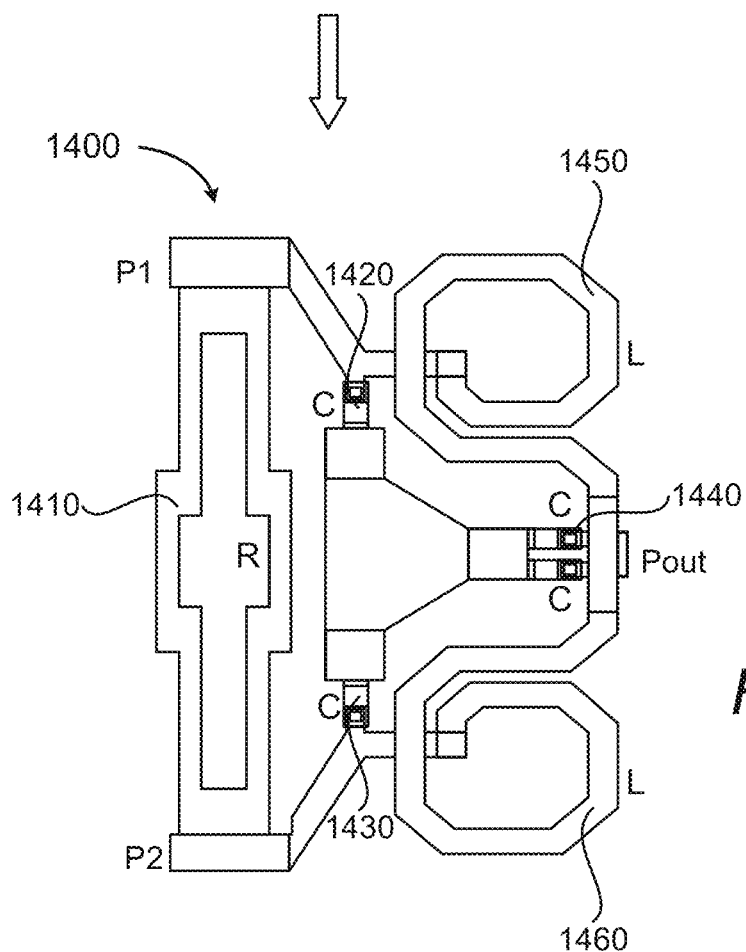

FIG. 14A illustrates a schematic of a proposed power combiner 1400 that includes an ESL-less resistor, and FIG. 14B illustrates a layout of the same power combiner 1400. The power combiner 1400 may combine signals provided at input ports P1 and P2 (referred to as first input port and second input port respectively for ease of reference) and output the combined result at an output port Pout. The power combiner 1400 may comprise a sheet resistor 1410 (e.g., an ESL-less sheet resistor), a first capacitor 1420, a second capacitor 1430, a third capacitor 1440, a first inductor 1450 and a second inductor 1460. The sheet resistor 1410 may be electrically connected between the first input port P1 and the second input port P2. The first capacitor 1420 may be electrically connected between the first input port P1 and ground, the second capacitor 1430 may be electrically connected between the second input port P2 and ground, and the third capacitor 1440 may be electrically connected between the output port Pout and ground. The first inductor 1450 may be electrically in series between the first input port P1 and the output port Pout, and the second inductor 1460 may be electrically in series between the second input port P2 and the output port Pout.

It should be noted that the power combiner 1400 is one or many proposed power combiners. While not shown, a power combiner that combines more than two inputs may be provided. For example, a four-input power combiner similar to the power combiner 700 may be fabricated. Also, the proposed power combiners may be implemented in integrated passive devices (IPDs).

Figure 15:
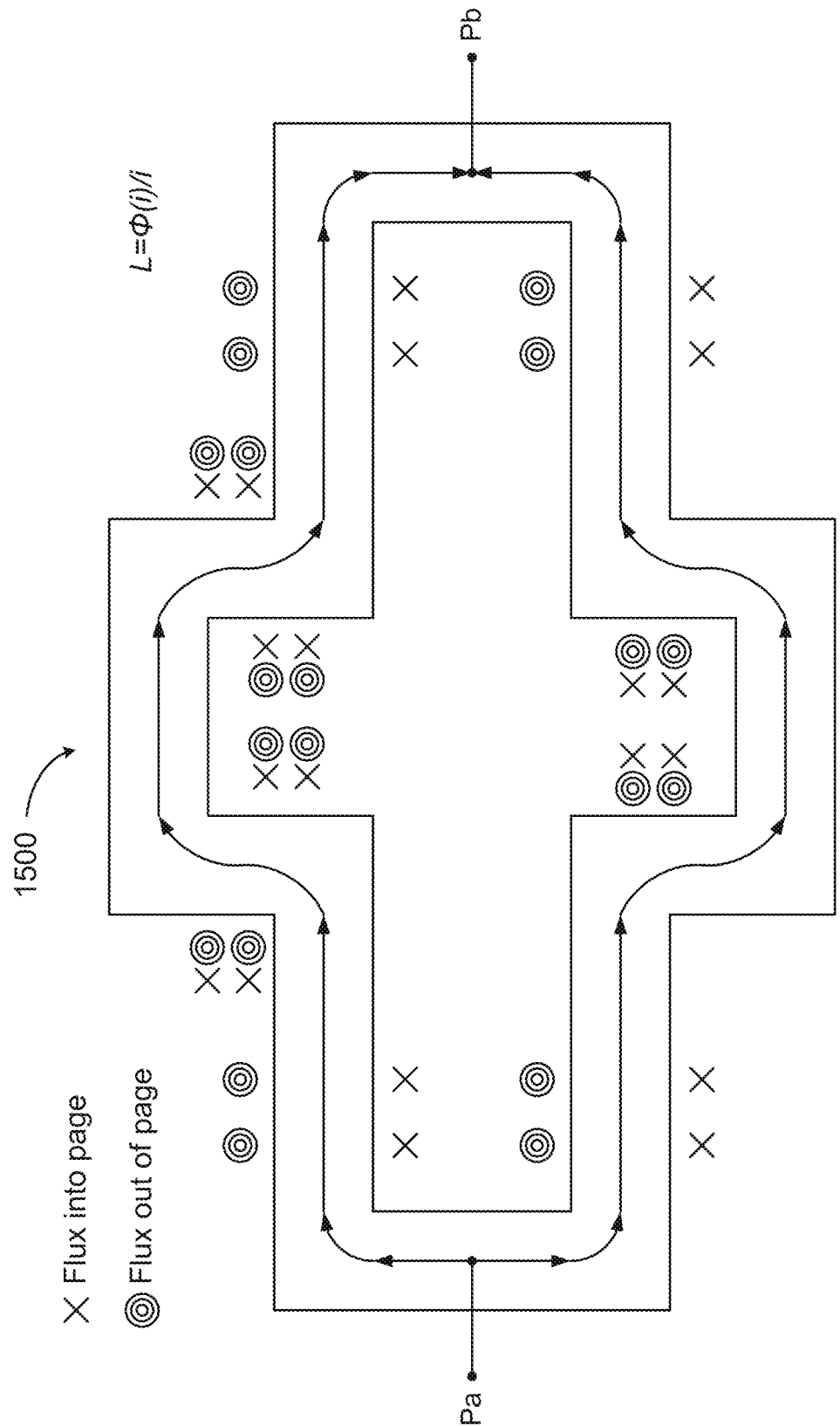
FIG. 15 illustrates an example sheet resistor configured to have canceling magnetic fluxes in accordance with one or more aspects of the disclosure.

The physics behind the self-inductance cancellation is explained with reference to FIG. 15 illustrating an ESL-less sheet resistor 1500. The sheet resistor 1410 of FIG. 14 may be an example of the ESL-less sheet resistor 1500. Note that there are two parallel current paths between first and second ports Pa and Pb of the sheet resistor 1500. For example, current may flow through the upper portion and the lower portion. As current flows through a path, magnetic flux Φ(i) due to current i is generated. However, due to the parallel current paths, the magnetic flux Φ(i) of one path can cancel out the magnetic flux Φ(i) of the other path. This can be particularly true in the space formed by the closed loop of the upper and lower portions. This implies that inductance L=Φ(i)/i may virtually be eliminated in the sheet resistor 1500. For ease of reference, this space may be referred to as the closed loop void. The meandering of the upper and lower paths also aids in the flux cancellation.

A geometry of a proposed ESL-less sheet resistor 1600 is explained with reference to FIG. 16. The sheet resistors 1410 and 1500 may be examples of the sheet resistor 1600. The sheet resistor 1600 may comprise an upper portion 1610 and a lower portion 1620. The upper and lower portions 1610, 1620 may be connected in parallel between first and second ports Pa, Pb. First and second ends of the upper portion 1610 may respectively be connected to the first and second ports Pa, Pb. Similarly, first and second ends of the lower portion 1620 may respectively be connected to the first and second ports Pa, Pb. The upper and lower portions 1610, 1620 may be connected such that a closed loop void 1630 is formed between them. In an aspect, the sheet resistor 1600 may be formed titanium nitride (TiN). However, it should be noted that the sheet resistor 1600 may be formed from other materials that may be formed as thin films. Also, the sheet resistor 1600 may be fabricated as part or component of IPDs, which may also comprise one or more capacitors and/or one or more inductors.

The upper portion 1610 may comprise one or more upper vertical portions and one or more upper horizontal portions. The one or more upper vertical portions and the one or more upper horizontal portions may be connected in series between the first port Pa and the second port Pb.

Figure 16:
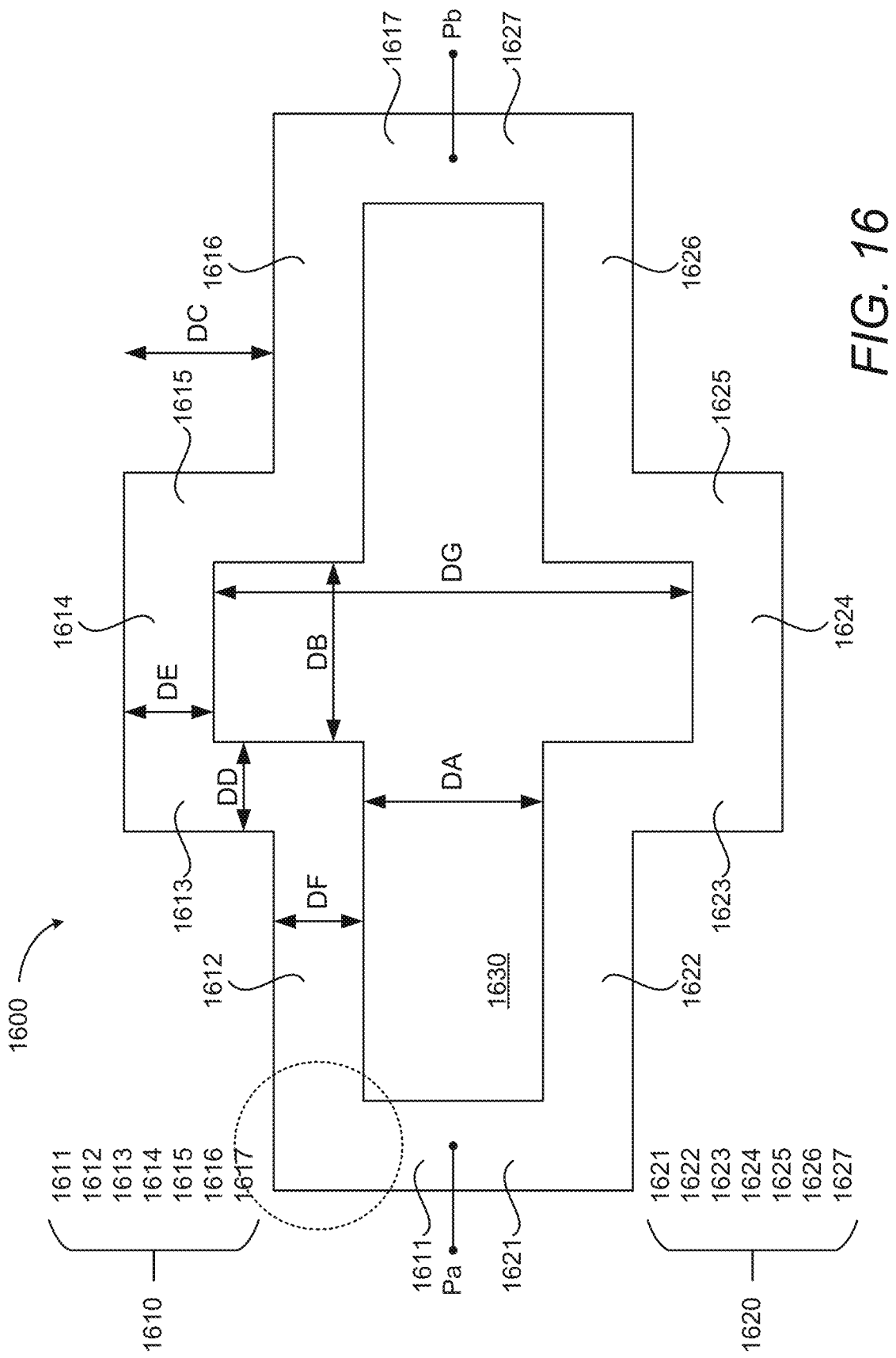
FIG. 16 illustrates an example sheet resistor in accordance with one or more aspects of the disclosure.

In the example sheet resistor 1600 of FIG. 16, the one or more upper vertical portions may comprise first, second, third and fourth upper vertical portions 1611, 1613, 1615, 1617. The one or more upper horizontal portions comprise first, second and third upper horizontal portions 1612, 1614, 1616. Along the upper portion 1610, the first port Pa may be electrically connected to the second port Pb through the first upper vertical portion 1611, the first upper horizontal portion 1612, the second upper vertical portion 1613, the second upper horizontal portion 1614, the third upper vertical portion 1615, the third upper horizontal portion 1616, and the fourth upper vertical portion 1617 in that order.

In an aspect, the upper portion 1610 may be mirrored with the lower portion 1620. That is, the lower portion 1620 may comprise one or more lower vertical portions and one or more lower horizontal portions. The one or more lower vertical portions and the one or more lower horizontal portions may be connected in series between the first port Pa and the second port Pb.

The one or more lower vertical portions may comprise first, second, third and fourth lower vertical portions 1621, 1623, 1625, 1627. The one or more lower horizontal portions comprise first, second and third lower horizontal portions 1622, 1624, 1626. Along the lower portion 1620, the first port Pa may be electrically connected to the second port Pb through the first lower vertical portion 1621, the first lower horizontal portion 1622, the second lower vertical portion 1623, the second lower horizontal portion 1624, the third lower vertical portion 1625, the third lower horizontal portion 1626, and the fourth lower vertical portion 1627 in that order.

In an aspect, distances or geometries of various parts of the sheet resistor 1600 may be specified or designed. In FIG. 16, various distances are defined as follows:

Distance A (DA) may refer to a vertical distance between the first upper horizontal portion 1612 and the first lower horizontal portion 1622 within the closed loop void 1630. More generally, DA may refer to a vertical distance between the first upper horizontal portion 1612 and the lower portion 1620, or may refer to a vertical distance between the upper portion 1610 and the first lower horizontal portion 1622.

Distance B (DB) may refer to a horizontal distance between the second upper vertical portion 1613 and the third upper vertical portion 1615 within the closed loop void 1630. Alternatively, DB may refer to a horizontal distance between the second lower vertical portion 1623 and the third lower vertical portion 1625 within the closed loop void 1630.

Distance C (DC) may refer to a distance between an upper surface of the second upper horizontal portion 1614 and an upper surface of the third upper horizontal portion 1616. Alternatively, DC may refer to a distance between a lower surface of the second lower horizontal portion 1624 and a lower surface of the third lower horizontal portion 1626.

Distance D (DD) may refer to a horizontal width of the second upper vertical portion 1613. Alternatively, DD may refer to a horizontal width of the second lower vertical portion 1623.

Distance E (DE) may refer to a vertical width of the second upper horizontal portion 1614. Alternatively, DE may refer to a vertical width of the second lower horizontal portion 1624.

Distance F (DF) may refer to a vertical width of the first upper horizontal portion 1612. Alternatively, DF may refer to a vertical width of the first lower horizontal portion 1622.

Distance G (DG) may refer to a vertical distance between the second upper horizontal portion 1614 and the second lower horizontal portion 1624 within the closed loop void 1630. More generally, DG may refer to a vertical distance between the second upper horizontal portion 1614 and the lower portion 1620, or may refer to a vertical distance between the upper portion 1610 and the second lower horizontal portion 1624.

For description purposes, DD (e.g., horizontal width of the second upper (lower) vertical portion 1613 (1623)) may be specified as W (e.g., DD=W), and other distances may be specified in relation to DD. Examples of such distances may be as follows:

DB may be at least 1.5 times DD (i.e., DB≥1.5×DD).

DE may be equal to DD (i.e., DE≈DD) within a threshold tolerance. In an aspect, the threshold tolerance may be defined as being within a fabrication tolerance of each other. For example, if a fabrication technique is such that a distance varies ±5 nm from design, then corresponding distances of two resistors may be considered as being equal if the distances are within 10 nm of each other. Alternatively, threshold tolerance may be defined as being within a threshold percentage of each other.

DF may be equal to DD (i.e., DF≈DD) within the threshold tolerance.

DA may be equal to twice DF (i.e., DE≈2×DF≈2×DD) within the threshold tolerance.

DC may be equal to DF (i.e., DC≈DF≈DD) within the threshold tolerance.

DG may be greater than DA (i.e., DG>DA).

Figure 17:
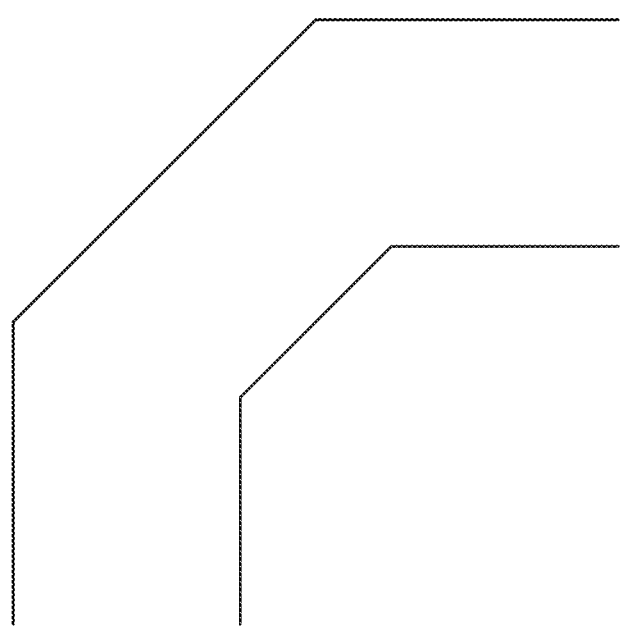
FIG. 17 illustrates a corner of an example sheet resistor in accordance with one or more aspects of the disclosure.

In FIG. 16, the transitions between vertical and horizontal portions are illustrated as right angles. This is of course a possibility. But in an aspect, the transitions may be more smooth. That is, they may be more rounded, or at least not so abrupt. In FIG. 16, a transition corner is highlighted with a dashed circle. FIG. 17 illustrates a more zoomed in view of the highlighted transition corner. As seen, the transition may be more gradual than the abrupt right angles.

Again, it is emphasized that the sheet resistor 1600 of FIG. 16 is merely an example. The proposed ESL-less resistor may take on a variety of geometries. Also, the sheet resistor 1600 may be utilized in IPD circuits such as power combiners.

Figure 18:
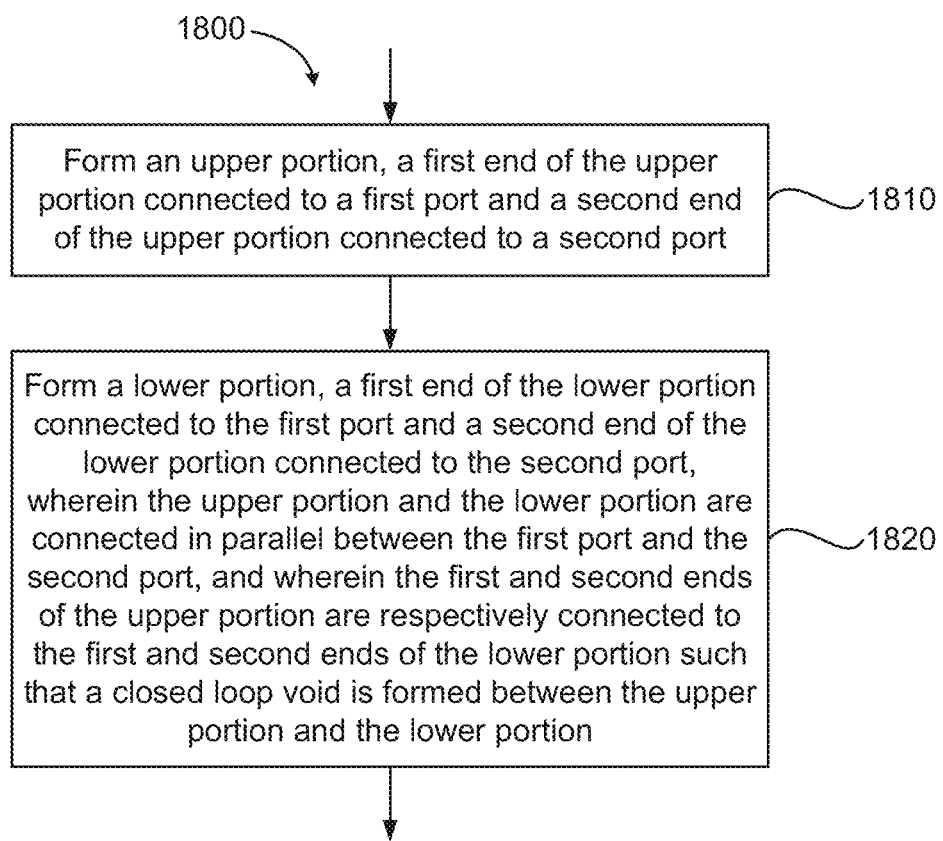
FIGS. 18, 19 and 20 illustrate flow charts of an example method of manufacturing a sheet resistor in accordance with one or more aspects of the disclosure.

FIG. 18 illustrates a flow chart of an example method 1800 of fabricating an ESL-less sheet resistor, such as the sheet resistor 1600. In block 1810, an upper portion 1610 may be formed. A first end of the upper portion 1610 may be connected to a first port Pa and a second end of the upper portion 1610 may be connected to a second port Pb.

Figure 19:
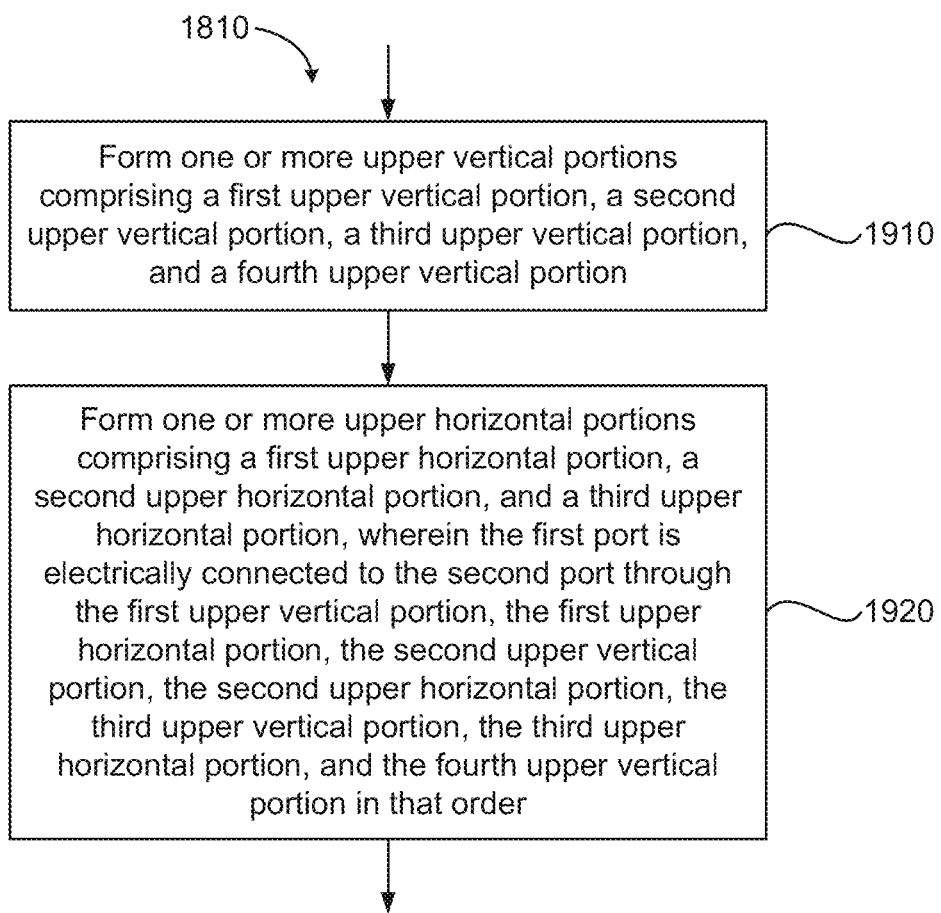

FIG. 19 illustrates a flow chart of a process to implement block 1810. In block 1910, one or more upper vertical portions may be formed. For example, first, second, third and fourth upper vertical portions 1611, 1613, 1615, 1617 may be formed. In block 1920, one or more upper horizontal portions may be formed. For example, first, second and third upper horizontal portions 1612, 1614, 1616 may be formed.

The one or more upper vertical portions and the one or more upper horizontal portions may be connected in series between the first port Pa and the second port Pb. For example, the first port Pa may be electrically connected to the second port Pb through the first upper vertical portion 1611, the first upper horizontal portion 1612, the second upper vertical portion 1613, the second upper horizontal portion 1614, the third upper vertical portion 1615, the third upper horizontal portion 1616, and the fourth upper vertical portion 1617 in that order.

Referring back to FIG. 18, in block 1820, a lower portion 1620 may be formed. A first end of the lower portion 1620 may be connected to the first port Pa and a second end of the lower portion 1620 may be connected to the second port Pb.

Figure 20:
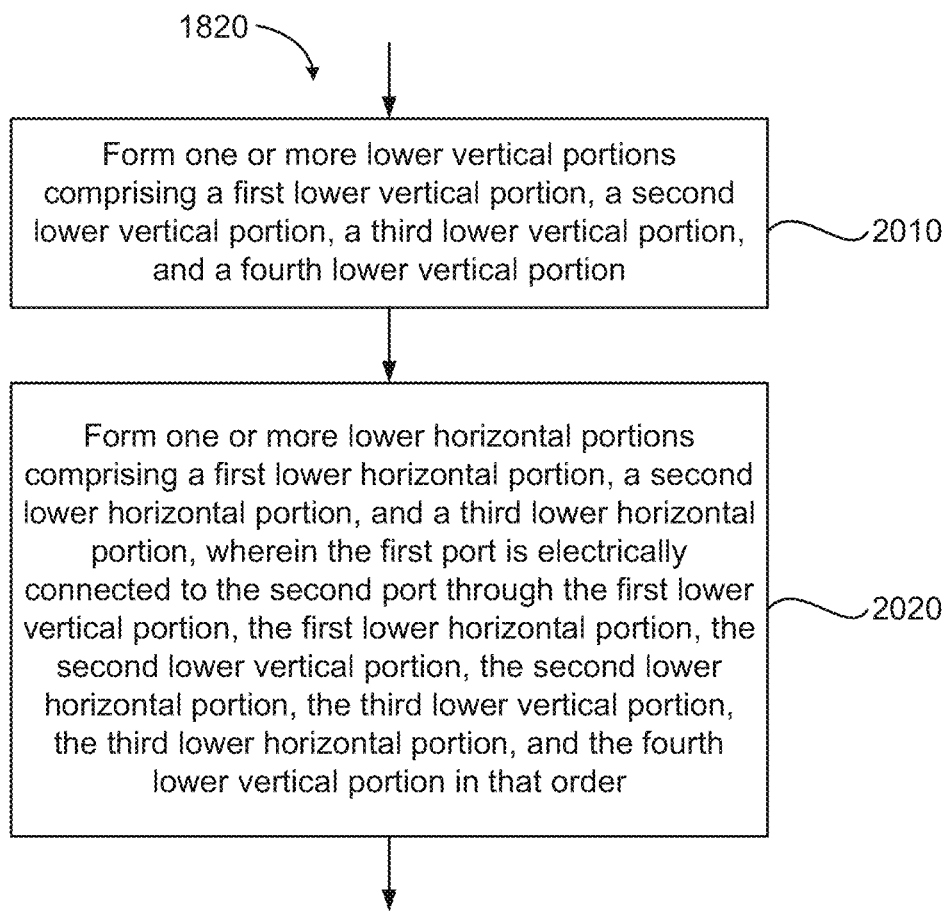

FIG. 20 illustrates a flow chart of a process to implement block 1820. In block 2010, one or more lower vertical portions may be formed. For example, first, second, third and fourth lower vertical portions 1621, 1623, 1625, 1627 may be formed. In block 2020, one or more lower horizontal portions may be formed. For example, first, second and third lower horizontal portions 1622, 1624, 1626 may be formed.

The one or more lower vertical portions and the one or more lower horizontal portions may be connected in series between the first port Pa and the second port Pb. For example, the first port Pa may be electrically connected to the second port Pb through the first lower vertical portion 1621, the first lower horizontal portion 1622, the second lower vertical portion 1623, the second lower horizontal portion 1624, the third lower vertical portion 1625, the third lower horizontal portion 1626, and the fourth lower vertical portion 1627 in that order.

It will be appreciated that the foregoing fabrication processes and related discussion were provided merely as a general illustration of some of the aspects of the disclosure and is not intended to limit the disclosure or accompanying claims. Further, many details in the fabrication process known to those skilled in the art may have been omitted or combined in summary process portions to facilitate an understanding of the various aspects disclosed without a detailed rendition of each detail and/or all possible process variations. Further, it will be appreciated that the illustrated configurations and descriptions are provided merely to aid in the explanation of the various aspects disclosed herein. For example, the number and location of the inductors, the metallization structure may have more or less conductive and insulating layers, the cavity orientation, size, whether it is formed of multiple cavities, is closed or open, and other aspects may have variations driven by specific application design features, such as the number of antennas, antenna type, frequency range, power, etc. Accordingly, the forgoing illustrative examples and associated figures should not be construed to limit the various aspects disclosed and claimed herein.

Figure 21:
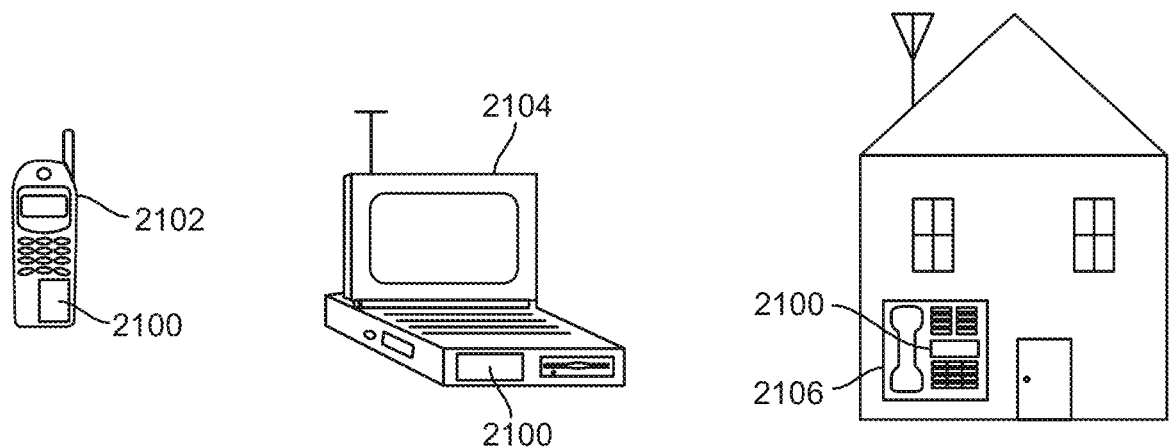
FIG. 21 illustrates various electronic devices which may utilize one or more aspects of the disclosure.

FIG. 21 illustrates various electronic devices that may be integrated with any of the aforementioned ESL-less resistors in accordance with various aspects of the disclosure. For example, a mobile phone device 2102, a laptop computer device 2104, and a fixed location terminal device 2106 may each be considered generally user equipment (UE) and may include devices 2100 in which one or more ESL-less resistors are incorporated as described herein. The devices 2102, 2104, 2106 illustrated in FIG. 21 are merely exemplary. Other electronic devices may also include the RF filter including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

The foregoing disclosed devices and functionalities may be designed and configured into computer files (e.g., RTL, GDSII, GERBER, etc.) stored on computer-readable media. Some or all such files may be provided to fabrication handlers who fabricate devices based on such files. Resulting products may include semiconductor wafers that are then cut into semiconductor die and packaged into an antenna on glass device. The antenna on glass device may then be employed in devices described herein.

Implementation examples are described in the following numbered clauses:

Clause 1: A sheet resistor, comprising: an upper portion, a first end of the upper portion connected to a first port and a second end of the upper portion connected to a second port; and a lower portion, a first end of the lower portion connected to the first port and a second end of the lower portion connected to the second port, wherein the upper portion and the lower portion are connected in parallel between the first port and the second port, and wherein the first end and the second end of the upper portion are respectively connected to the first end and the second end of the lower portion such that a closed loop void is formed between the upper portion and the lower portion.

Clause 2: The sheet resistor of clause 1, wherein the sheet resistor is formed from titanium nitride (TiN).

Clause 3: The sheet resistor of any of clauses 1-2, wherein the sheet resistor is formed as a part of an integrated passive device (IPD).

Clause 4: The sheet resistor of clause 3, wherein the IPD also comprises: one or more capacitors; one or more inductors; or both.

Clause 5: The sheet resistor of any of clauses 1-4, wherein the upper portion comprises: one or more upper vertical portions; and one or more upper horizontal portions, the one or more upper vertical portions and the one or more upper horizontal portions being connected in series between the first port and the second port.

Clause 6: The sheet resistor of clause 5, wherein the one or more upper vertical portions comprise a first upper vertical portion, a second upper vertical portion, a third upper vertical portion, and a fourth upper vertical portion, wherein the one or more upper horizontal portions comprise a first upper horizontal portion, a second upper horizontal portion, and a third upper horizontal portion, and wherein the first port is electrically connected to the second port through the first upper vertical portion, the first upper horizontal portion, the second upper vertical portion, the second upper horizontal portion, the third upper vertical portion, the third upper horizontal portion, and the fourth upper vertical portion in that order.

Clause 7: The sheet resistor of clause 6, wherein a horizontal distance between the second upper vertical portion and the third upper horizontal portion within the closed loop void is at least 1.5 times a horizontal width of the second upper vertical portion, a vertical width of the second upper horizontal portion is equal to the horizontal width of the second upper vertical portion within a threshold tolerance, a vertical width of the first upper horizontal portion is equal to the horizontal width of the second upper vertical portion within the threshold tolerance, and a distance between an upper surface of the second upper horizontal portion and an upper surface of the third upper horizontal portion is equal to the vertical width of the first upper horizontal portion within the threshold tolerance.

Clause 8: The sheet resistor of clause 7, wherein within the closed loop void, a vertical distance between the first upper horizontal portion and the lower portion is equal to twice the vertical width of the first upper horizontal portion within the threshold tolerance.

Clause 9: The sheet resistor of clause 8, wherein within the closed loop void, a vertical distance between the second upper horizontal portion and the lower portion is greater than the vertical distance between the first upper horizontal portion and the lower portion.

Clause 10: The sheet resistor of any of clauses 1-9, wherein the lower portion comprises: one or more lower vertical portions; and one or more lower horizontal portions, the one or more lower vertical portions and the one or more lower horizontal portions being connected in series between the first port and the second port.

Clause 11: The sheet resistor of clause 10, wherein the one or more lower vertical portions comprise a first lower vertical portion, a second lower vertical portion, a third lower vertical portion, and a fourth lower vertical portion, wherein the one or more lower horizontal portions comprise a first lower horizontal portion, a second lower horizontal portion, and a third lower horizontal portion, and wherein the first port is electrically connected to the second port through the first lower vertical portion, the first lower horizontal portion, the second lower vertical portion, the second lower horizontal portion, the third lower vertical portion, the third lower horizontal portion, and the fourth lower vertical portion in that order.

Clause 12: The sheet resistor of any of clauses 1-11, wherein the sheet resistor is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

Clause 13: A power combiner, comprising: one or more resistors comprising a sheet resistor; one or more capacitors comprising a first capacitor, a second capacitor, and a third capacitor; and one or more inductors comprising a first inductor and a second inductor, wherein the sheet resistor is electrically connected between a first input port and a second input port, wherein the first capacitor is electrically connected between the first input port and a ground, the second capacitor is electrically connected between the second input port and the ground, and the third capacitor is electrically connected between an output port and the ground, wherein the first inductor is electrically connected between the first input port and the output port, and the second inductor is electrically connected between the second input port and the output port, and wherein the sheet resistor comprises: an upper portion, a first end of the upper portion connected to the first input port and a second end of the upper portion connected to the second input port; and a lower portion, a first end of the lower portion connected to the first input port and a second end of the lower portion connected to the second input port, wherein the upper portion and the lower portion are connected in parallel between the first input port and the second input port, and wherein the first end and the second end of the upper portion are respectively connected to the first end and the second end of the lower portion such that a closed loop void is formed between the upper portion and the lower portion.

Clause 14: The power combiner of clause 13, wherein the sheet resistor is formed from titanium nitride (TiN).

Clause 15: The power combiner of any of clauses 13-14, wherein the sheet resistor, at least one capacitor, and at least one inductor are formed as parts of an integrated passive device (IPD).

Clause 16: The power combiner of any of clauses 13-15, wherein the upper portion comprises: one or more upper vertical portions; and one or more upper horizontal portions, the one or more upper vertical portions and the one or more upper horizontal portions being connected in series between the first port and the second port.

Clause 17: The power combiner of clause 16, wherein the one or more upper vertical portions comprise a first upper vertical portion, a second upper vertical portion, a third upper vertical portion, and a fourth upper vertical portion, wherein the one or more upper horizontal portions comprise a first upper horizontal portion, a second upper horizontal portion, and a third upper horizontal portion, and wherein the first port is electrically connected to the second port through the first upper vertical portion, the first upper horizontal portion, the second upper vertical portion, the second upper horizontal portion, the third upper vertical portion, the third upper horizontal portion, and the fourth upper vertical portion in that order.

Clause 18: The power combiner of clause 17, wherein a horizontal distance between the second upper vertical portion and the third upper horizontal portion within the closed loop void is at least 1.5 times a horizontal width of the second upper vertical portion, a vertical width of the second upper horizontal portion is equal to the horizontal width of the second upper vertical portion within a threshold tolerance, a vertical width of the first upper horizontal portion is equal to the horizontal width of the second upper vertical portion within the threshold tolerance, and a distance between an upper surface of the second upper horizontal portion and an upper surface of the third upper horizontal portion is equal to the vertical width of the first upper horizontal portion within the threshold tolerance.

Clause 19: The power combiner of clauses 18, wherein within the closed loop void, a vertical distance between the first upper horizontal portion and the lower portion is equal to twice the vertical width of the first upper horizontal portion within the threshold tolerance.

Clause 20: The power combiner of clause 19, wherein within the closed loop void, a vertical distance between the second upper horizontal portion and the lower portion is greater than the vertical distance between the first upper horizontal portion and the lower portion.

Clause 21: The power combiner of any of clauses 13-20, wherein the lower portion comprises: one or more lower vertical portions; and one or more lower horizontal portions, the one or more lower vertical portions and the one or more lower horizontal portions being connected in series between the first port and the second port.

Clause 22: The power combiner of clause 21, wherein the one or more lower vertical portions comprise a first lower vertical portion, a second lower vertical portion, a third lower vertical portion, and a fourth lower vertical portion, wherein the one or more lower horizontal portions comprise a first lower horizontal portion, a second lower horizontal portion, and a third lower horizontal portion, and wherein the first port is electrically connected to the second port through the first lower vertical portion, the first lower horizontal portion, the second lower vertical portion, the second lower horizontal portion, the third lower vertical portion, the third lower horizontal portion, and the fourth lower vertical portion in that order.

Clause 23: The power combiner of any of clauses 13-22, wherein the power combiner is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

Clause 24: A method of fabricating a sheet resistor, the method comprising: forming an upper portion, a first end of the upper portion connected to a first port and a second end of the upper portion connected to a second port; and forming a lower portion, a first end of the lower portion connected to the first port and a second end of the lower portion connected to the second port, wherein the upper portion and the lower portion are connected in parallel between the first port and the second port, and wherein the first end and the second end of the upper portion are respectively connected to the first end and the second end of the lower portion such that a closed loop void is formed between the upper portion and the lower portion.

Clause 25: The method of clause 24, wherein the sheet resistor is formed from titanium nitride (TiN).

Clause 26: The method of any of clauses 24-25, wherein the sheet resistor is formed as a part of an integrated passive device (IPD).

Clause 27: The method of clause 26, wherein the IPD also comprises: one or more capacitors; one or more inductors; or both.

Clause 28: The method of any of clauses 24-27, wherein forming the upper portion comprises: forming one or more upper vertical portions; and forming one or more upper horizontal portions, the one or more upper vertical portions and the one or more upper horizontal portions being connected in series between the first port and the second port.

Clause 29: The method of clause 28, wherein the one or more upper vertical portions comprise a first upper vertical portion, a second upper vertical portion, a third upper vertical portion, and a fourth upper vertical portion, wherein the one or more upper horizontal portions comprise a first upper horizontal portion, a second upper horizontal portion, and a third upper horizontal portion, and wherein the first port is electrically connected to the second port through the first upper vertical portion, the first upper horizontal portion, the second upper vertical portion, the second upper horizontal portion, the third upper vertical portion, the third upper horizontal portion, and the fourth upper vertical portion in that order.

Clause 30: The method of clause 29, wherein a horizontal distance between the second upper vertical portion and the third upper horizontal portion within the closed loop void is at least 1.5 times a horizontal width of the second upper vertical portion, a vertical width of the second upper horizontal portion is equal to the horizontal width of the second upper vertical portion within a threshold tolerance, a vertical width of the first upper horizontal portion is equal to the horizontal width of the second upper vertical portion within the threshold tolerance, and a distance between an upper surface of the second upper horizontal portion and an upper surface of the third upper horizontal portion is equal to the vertical width of the first upper horizontal portion within the threshold tolerance.

Clause 31: The method of clause 30, wherein within the closed loop void, a vertical distance between the first upper horizontal portion and the lower portion is equal to twice the vertical width of the first upper horizontal portion within the threshold tolerance.

Clause 32: The method of clause 31, wherein within the closed loop void, a vertical distance between the second upper horizontal portion and the lower portion is greater than the vertical distance between the first upper horizontal portion and the lower portion.

Clause 33: The method of any of clauses 24-32, wherein the forming lower portion comprises: forming one or more lower vertical portions; and forming one or more lower horizontal portions, the one or more lower vertical portions and the one or more lower horizontal portions being connected in series between the first port and the second port.

Clause 34: The method of clause 33, wherein the one or more lower vertical portions comprise a first lower vertical portion, a second lower vertical portion, a third lower vertical portion, and a fourth lower vertical portion, wherein the one or more lower horizontal portions comprise a first lower horizontal portion, a second lower horizontal portion, and a third lower horizontal portion, and wherein the first port is electrically connected to the second port through the first lower vertical portion, the first lower horizontal portion, the second lower vertical portion, the second lower horizontal portion, the third lower vertical portion, the third lower horizontal portion, and the fourth lower vertical portion in that order.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to either an uplink/reverse or downlink/forward traffic channel.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), 5G New Radio, Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart) is a wireless personal area network technology designed and marketed by the Bluetooth Special Interest Group intended to provide considerably reduced power consumption and cost while maintaining a similar communication range. BLE was merged into the main Bluetooth standard in 2010 with the adoption of the Bluetooth Core Specification Version 4.0 and updated in Bluetooth 5.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described herein can be configured to perform at least a portion of a method described herein.

It should be noted that the terms "connected," "coupled," or any variant thereof, mean any connection or coupling, either direct or indirect, between elements, and can encompass a presence of an intermediate element between two elements that are "connected" or "coupled" together via the intermediate element unless the connection is expressly disclosed as being directly connected.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or one or more claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods, systems, and apparatus disclosed in the description or in the claims can be implemented by a device comprising means for performing the respective actions and/or functionalities of the methods disclosed.

Furthermore, in some examples, an individual action can be subdivided into one or more sub-actions or contain one or more sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A sheet resistor, comprising:
   an upper portion, a first end of the upper portion connected to a first port and a second end of the upper portion connected to a second port; and
   a lower portion, a first end of the lower portion connected to the first port and a second end of the lower portion connected to the second port,
   wherein the upper portion and the lower portion are connected in parallel between the first port and the second port,
   wherein the first end and the second end of the upper portion are respectively connected to the first end and the second end of the lower portion such that a closed loop void is formed between the upper portion and the lower portion,
   wherein the upper portion comprises one or more upper vertical portions and one or more upper horizontal portions, the one or more upper vertical portions and the one or more upper horizontal portions being connected in series between the first port and the second port,
   wherein the one or more upper vertical portions comprise a first upper vertical portion, a second upper vertical portion, a third upper vertical portion, and a fourth upper vertical portion,
   wherein the one or more upper horizontal portions comprise a first upper horizontal portion, a second upper horizontal portion, and a third upper horizontal portion, and
   wherein the first port is electrically connected to the second port through the first upper vertical portion, the first upper horizontal portion, the second upper vertical portion, the second upper horizontal portion, the third upper vertical portion, the third upper horizontal portion, and the fourth upper vertical portion in that order.

2. The sheet resistor of claim 1, wherein the sheet resistor is formed from titanium nitride (TiN).

3. The sheet resistor of claim 1, wherein the sheet resistor is formed as a part of an integrated passive device (IPD).

4. The sheet resistor of claim 3, wherein the IPD also comprises:
   one or more capacitors;
   one or more inductors; or
   both.

5. The sheet resistor of claim 1, wherein
   a horizontal distance between the second upper vertical portion and the third upper horizontal portion within the closed loop void is at least 1.5 times a horizontal width of the second upper vertical portion,
   a vertical width of the second upper horizontal portion is equal to the horizontal width of the second upper vertical portion within a threshold tolerance,
   a vertical width of the first upper horizontal portion is equal to the horizontal width of the second upper vertical portion within the threshold tolerance, and
   a distance between an upper surface of the second upper horizontal portion and an upper surface of the third upper horizontal portion is equal to the vertical width of the first upper horizontal portion within the threshold tolerance.

6. The sheet resistor of claim 5, wherein within the closed loop void, a vertical distance between the first upper horizontal portion and the lower portion is equal to twice the vertical width of the first upper horizontal portion within the threshold tolerance.

7. The sheet resistor of claim 6, wherein within the closed loop void, a vertical distance between the second upper horizontal portion and the lower portion is greater than the vertical distance between the first upper horizontal portion and the lower portion.

8. The sheet resistor of claim 1, wherein the lower portion comprises:
   one or more lower vertical portions; and
   one or more lower horizontal portions,
   the one or more lower vertical portions and the one or more lower horizontal portions being connected in series between the first port and the second port.

9. The sheet resistor of claim 8,
   wherein the one or more lower vertical portions comprise a first lower vertical portion, a second lower vertical portion, a third lower vertical portion, and a fourth lower vertical portion,
   wherein the one or more lower horizontal portions comprise a first lower horizontal portion, a second lower horizontal portion, and a third lower horizontal portion, and
   wherein the first port is electrically connected to the second port through the first lower vertical portion, the first lower horizontal portion, the second lower vertical portion, the second lower horizontal portion, the third lower vertical portion, the third lower horizontal portion, and the fourth lower vertical portion in that order.

10. The sheet resistor of claim 1, wherein the sheet resistor is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

11. A power combiner, comprising:
    one or more resistors comprising a sheet resistor;
    one or more capacitors comprising a first capacitor, a second capacitor, and a third capacitor; and
    one or more inductors comprising a first inductor and a second inductor,
    wherein the sheet resistor is electrically connected between a first input port and a second input port,
    wherein the first capacitor is electrically connected between the first input port and a ground, the second capacitor is electrically connected between the second input port and the ground, and the third capacitor is electrically connected between an output port and the ground,
    wherein the first inductor is electrically connected between the first input port and the output port, and the second inductor is electrically connected between the second input port and the output port, and
    wherein the sheet resistor comprises:
       an upper portion, a first end of the upper portion connected to the first input port and a second end of the upper portion connected to the second input port; and
       a lower portion, a first end of the lower portion connected to the first input port and a second end of the lower portion connected to the second input port, wherein the upper portion and the lower portion are connected in parallel between the first input port and the second input port, and wherein the first end and the second end of the upper portion are respectively connected to the first end and the second end of the lower portion such that a closed loop void is formed between the upper portion and the lower portion.

12. The power combiner of claim 11, wherein the sheet resistor is formed from titanium nitride (TiN).

13. The power combiner of claim 11, wherein the sheet resistor, at least one capacitor, and at least one inductor are formed as parts of an integrated passive device (IPD).

14. The power combiner of claim 11, wherein the upper portion comprises:
one or more upper vertical portions; and
one or more upper horizontal portions,
the one or more upper vertical portions and the one or more upper horizontal portions being connected in series between the first input port and the second input port.

15. The power combiner of claim 14,
wherein the one or more upper vertical portions comprise a first upper vertical portion, a second upper vertical portion, a third upper vertical portion, and a fourth upper vertical portion,
wherein the one or more upper horizontal portions comprise a first upper horizontal portion, a second upper horizontal portion, and a third upper horizontal portion, and
wherein the first input port is electrically connected to the second input port through the first upper vertical portion, the first upper horizontal portion, the second upper vertical portion, the second upper horizontal portion, the third upper vertical portion, the third upper horizontal portion, and the fourth upper vertical portion in that order.

16. The power combiner of claim 15, wherein
a horizontal distance between the second upper vertical portion and the third upper horizontal portion within the closed loop void is at least 1.5 times a horizontal width of the second upper vertical portion,
a vertical width of the second upper horizontal portion is equal to the horizontal width of the second upper vertical portion within a threshold tolerance,
a vertical width of the first upper horizontal portion is equal to the horizontal width of the second upper vertical portion within the threshold tolerance, and
a distance between an upper surface of the second upper horizontal portion and an upper surface of the third upper horizontal portion is equal to the vertical width of the first upper horizontal portion within the threshold tolerance.

17. The power combiner of claim 16, wherein within the closed loop void, a vertical distance between the first upper horizontal portion and the lower portion is equal to twice the vertical width of the first upper horizontal portion within the threshold tolerance.

18. The power combiner of claim 17, wherein within the closed loop void, a vertical distance between the second upper horizontal portion and the lower portion is greater than the vertical distance between the first upper horizontal portion and the lower portion.

19. The power combiner of claim 11, wherein the lower portion comprises:
one or more lower vertical portions; and
one or more lower horizontal portions,
the one or more lower vertical portions and the one or more lower horizontal portions being connected in series between the first input port and the second input port.

20. The power combiner of claim 19,
wherein the one or more lower vertical portions comprise a first lower vertical portion, a second lower vertical portion, a third lower vertical portion, and a fourth lower vertical portion,
wherein the one or more lower horizontal portions comprise a first lower horizontal portion, a second lower horizontal portion, and a third lower horizontal portion, and
wherein the first input port is electrically connected to the second input port through the first lower vertical portion, the first lower horizontal portion, the second lower vertical portion, the second lower horizontal portion, the third lower vertical portion, the third lower horizontal portion, and the fourth lower vertical portion in that order.

21. The power combiner of claim 11, wherein the power combiner is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

22. A method of fabricating a sheet resistor, the method comprising:
forming an upper portion, a first end of the upper portion connected to a first port and a second end of the upper portion connected to a second port; and
forming a lower portion, a first end of the lower portion connected to the first port and a second end of the lower portion connected to the second port,
wherein the upper portion and the lower portion are connected in parallel between the first port and the second port,
wherein the first end and the second end of the upper portion are respectively connected to the first end and the second end of the lower portion such that a closed loop void is formed between the upper portion and the lower portion, and
wherein forming the upper portion comprises:
forming one or more upper vertical portions comprising a first upper vertical portion, a second upper vertical portion, a third upper vertical portion, and a fourth upper vertical portion, and
forming one or more upper horizontal portions comprising a first upper horizontal portion, a second upper horizontal portion, and a third upper horizontal portion,
wherein the first port is electrically connected to the second port through the first upper vertical portion, the first upper horizontal portion, the second upper vertical portion, the second upper horizontal portion, the third upper vertical portion, the third upper horizontal portion, and the fourth upper vertical portion in that order.

23. The method of claim 22, wherein the sheet resistor is formed from titanium nitride (TiN).

24. The method of claim 22, wherein
a horizontal distance between the second upper vertical portion and the third upper horizontal portion within the closed loop void is at least 1.5 times a horizontal width of the second upper vertical portion, a vertical width of the second upper horizontal portion is equal to the horizontal width of the second upper vertical portion within a threshold tolerance, a vertical width of the first upper horizontal portion is equal to the horizontal width of the second upper vertical portion within the threshold tolerance, and a distance between an upper surface of the second upper horizontal portion and an upper surface of the third upper horizontal portion is equal to the vertical width of the first upper horizontal portion within the threshold tolerance.

25. The method of claim 24, wherein within the closed loop void, a vertical distance between the first upper horizontal portion and the lower portion is equal to twice the vertical width of the first upper horizontal portion within the threshold tolerance.

26. The method of claim 25, wherein within the closed loop void, a vertical distance between the second upper horizontal portion and the lower portion is greater than the vertical distance between the first upper horizontal portion and the lower portion.

27. The method of claim 22, wherein forming the lower portion comprises:

forming one or more lower vertical portions comprising a first lower vertical portion, a second lower vertical portion, a third lower vertical portion, and a fourth lower vertical portion; and forming one or more lower horizontal portions comprising a first lower horizontal portion, a second lower horizontal portion, and a third lower horizontal portion, wherein the first port is electrically connected to the second port through the first lower vertical portion, the first lower horizontal portion, the second lower vertical portion, the second lower horizontal portion, the third lower vertical portion, the third lower horizontal portion, and the fourth lower vertical portion in that order.

* * * * *